United States Patent [19]

Funada

[11] Patent Number: 5,586,007
[45] Date of Patent: Dec. 17, 1996

[54] CIRCUIT BOARD HAVING IMPROVED THERMAL RADIATION

[75] Inventor: Masao Funada, Kanagawa, Japan

[73] Assignee: Fuji Xerox Co., Ltd., Tokyo, Japan

[21] Appl. No.: 542,700

[22] Filed: Oct. 13, 1995

Related U.S. Application Data

[62] Division of Ser. No. 201,130, Feb. 24, 1994, Pat. No. 5,500,785.

[30] Foreign Application Priority Data

Feb. 24, 1993 [JP] Japan ..................... 5-035377

[51] Int. Cl.⁶ ........................................ H05K 7/20
[52] U.S. Cl. .................. 361/720; 174/252; 174/255; 174/259; 361/808
[58] Field of Search .................... 174/252, 255, 174/259; 361/704, 707–708, 719–721, 807, 808

[56] References Cited

U.S. PATENT DOCUMENTS

| | | | |
|---|---|---|---|
| 4,941,067 | 7/1990 | Craft | 361/386 |
| 4,945,451 | 7/1990 | Gohl et al. | 361/386 |
| 5,019,941 | 5/1991 | Craft | 361/386 |
| 5,050,038 | 9/1991 | Malaurie et al. | 361/386 |
| 5,113,315 | 5/1992 | Capp et al. | 361/386 |

FOREIGN PATENT DOCUMENTS

| | | |
|---|---|---|
| 3-297151 | 12/1991 | Japan . |
| 4-23336 | 1/1992 | Japan . |
| 4-35373 | 2/1992 | Japan . |
| 4-123462 | 4/1992 | Japan . |
| 4-105396 | 4/1992 | Japan . |
| 4-219083 | 8/1992 | Japan . |

*Primary Examiner*—Gregory D. Thompson
*Attorney, Agent, or Firm*—Finnegan, Henderson, Farabow, Garrett & Dunner, L.L.P.

[57] ABSTRACT

A circuit board consisting of an insulating substrate, a die bonding pad for fixedly bonding a semiconductor element onto the insulating substrate, and a wiring layer, in such a manner that the die bonding pad and wire layer are formed on the insulating substrate. A first heat conducting/radiating layer formed on the portion of the surface of the insulating substrate where the wiring layer and the die bonding pad are not formed, in such a manner that the first heat conducting/radiating layer is thermally connected to the die bonding pad. A second heat conducting/radiating layer is formed on the rear surface of the insulating substrate, and a heat bridge through which the die bonding pad or the first heat conducting/radiating layer is connected to the second heat conducting/radiating layer. The circuit board is light and small, and high in heat radiating characteristic, and low in manufacturing cost.

10 Claims, 5 Drawing Sheets

CIRCUIT BOARD HAVING IMPROVED THERMAL RADIATION

This is a division of application Ser. No. 08/201,130, filed Feb. 24, 1994 now U.S. Pat. No. 5,500,785.

BACKGROUND OF THE INVENTION

This invention relates to circuit boards, and more particularly to an improvement of the heat radiation characteristic of a semiconductor element fixedly bonded onto the circuit board.

In order to cool a semiconductor element such as an LSI fixedly bonded on a circuit board, the following two methods have been proposed in the art: In one of the methods, as disclosed by Japanese Patent Application (OPI) No. 35373/1992 (the term "OPI" as used herein means an "unexamined application") a circuit board is formed by using a high thermal-conduction substrate high in heat conductivity, higher than 10 W/m K, to improve the heat radiating characteristic of an image sensor. The other method is an LSI mounting method in which, as disclosed by Japanese Patent Application (OPI) No's 123462/1992 and 219083/1992, a high thermal-conduction substrate and an electronic cooling element such as a Peltier element are used in combination.

Figure 7:
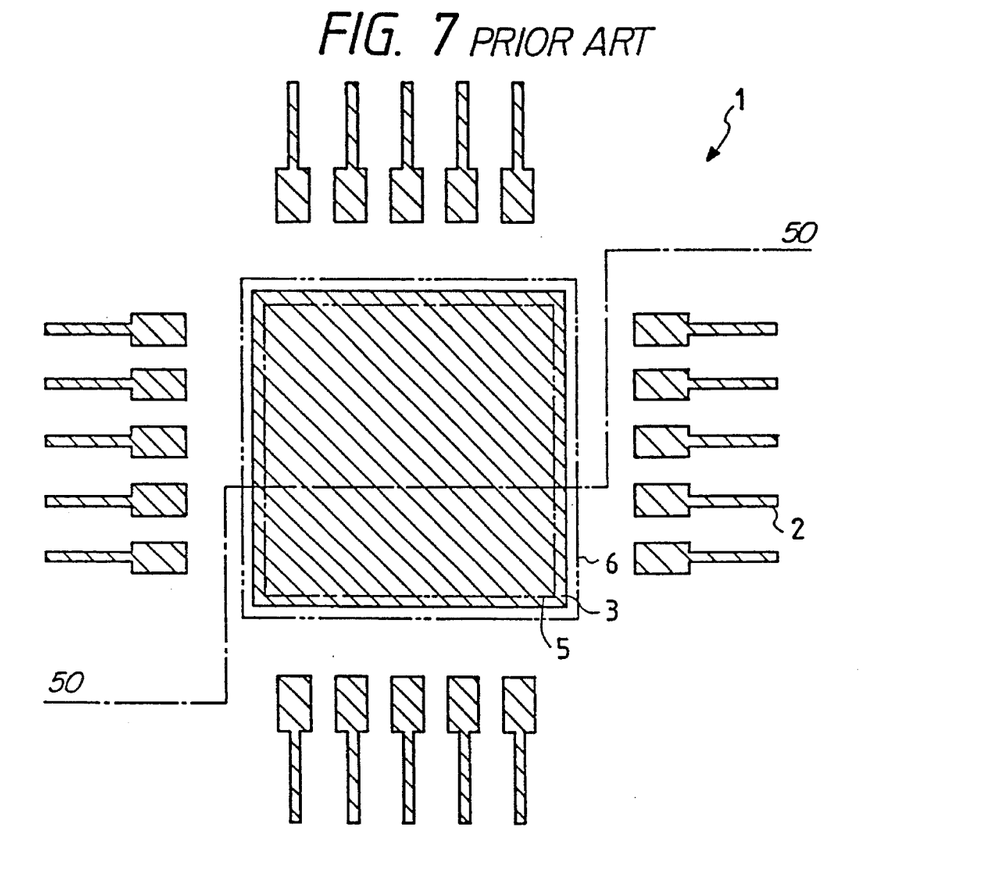
FIG. 7 is a plan view outlining the arrangement of a conventional circuit board.

One example of the prior art will be described with reference to FIGS. 7 and 8. FIG. 7 is a plan view outlining the arrangement of a conventional circuit board, and FIG. 8 is a sectional view taken along line 50—50 in FIG. 7.

Figure 8:
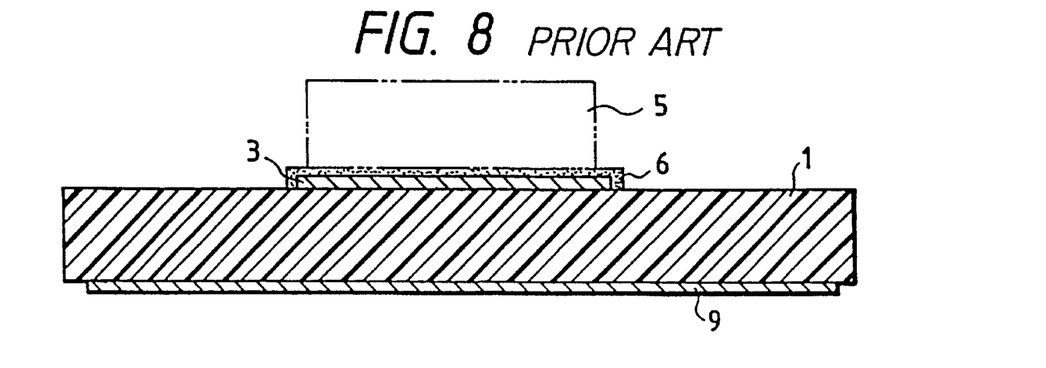
FIG. 8 is a sectional view taken along line 50—50 in FIG. 7.

As shown in FIGS. 7 and 8, a plurality of wire bonding pads 2, and a die bonding pad 3 are arranged on the upper surface of an electrically insulating substrate 1. The wire bonding pads 2 are connected through bonding wires to a bonding pad (not shown) of a semiconductor element 5 (indicated by the two-dot chain line), and the die bonding pad 3 is positioned where the semiconductor element 5 is to be provided. Furthermore, a heat conducting/radiating layer 9 is formed on the lower surface of the substrate 1.

The wire bonding pads 2, the die bonding pad 3, and the heat conducting/radiating layer 9 are formed by using an electrically conductive material such as a copper material according to the conventional method. The semiconductor element 5 is fixedly bonded to the insulating substrate 1 with a thermally conductive adhesive agent 6 such as an adhesive agent "H70E-4" manufactured by the EpoTek company. The heat conducting/radiating layer 9 is spread over the lower surface of the insulating substrate 1, serving as a grounding layer. In general, the heat conducting/radiating layer 9 is directly exposed in the air without being covered with "Solder-resist", or it is fixedly connected to a casing which is, for instance, made of a metal plate.

In the circuit board thus constructed, the heat generated by the semiconductor element 5 is transmitted through the thermally conductive adhesive agent 6 to the die bonding pad 3, and then through the insulating substrate 1 to the heat conducting/radiating layer 9 formed on the lower surface of the insulating substrate 1, thus being radiated into the air or the metal casing.

However, the above-described heat radiating method suffers from a problem that, since the insulating substrate 1 is low in heat conducting speed and large in thermal capacity, the temperature of the insulating substrate 1 is increased, so that the heat from the semiconductor element 5 is not sufficiently radiated.

Furthermore, the above-described method is disadvantageous in the following points: In the method, the substrate is expensive. Furthermore, in the method, it is necessary to use additional devices for cooling or heat-radiating the semiconductor element, and therefore it is difficult to reduce the weight of the circuit board; that is, it is difficult to provide a circuit board light in weight. In order to control the additional devices, the number of signal lines is accordingly increased, and the power consumption is also increased. That is, the method is not economical against the desire of the user.

SUMMARY OF THE INVENTION

In view of the foregoing, an object of this invention is to provide a circuit board which needs no additional devices for cooling and heat-radiating a semiconductor element mounted on it.

Another object of the invention is to provide a circuit board which is light in weight, small in size, high in heat radiating characteristic, low in manufacturing cost, and which need not increase the number of signal lines.

A further object of the invention is to provide a circuit board excellent in heat radiating characteristic without addition of new materials or electronic components, in which the heat generated by the semiconductor element is quickly diffused, and the heat thus diffused is radiated through a large heat radiating surface.

The foregoing objects and other objects of the invention have been achieved by the following means:

The first means is a circuit board comprising: an insulating substrate; and a die bonding pad for fixedly bonding a semiconductor element onto the insulating substrate; and a wiring layer, in such a manner that the die bonding pad and the wire layer are formed on the insulating substrate, in which, according to one aspect of the invention, a heat conducting/radiating layer is formed on the portion of the surface of the insulating substrate where the wiring layer and the die bonding pad are not formed, in such a manner that the heat conducting/radiating layer is thermally connected to the die bonding pad.

The second means is a circuit board comprising: an insulating substrate; and a die bonding pad for fixedly bonding a semiconductor element onto the insulating substrate; and a wiring layer, in such a manner that the die bonding pad and wire layer are formed on the insulating substrate, which, according to another aspect of the invention, comprises:

a heat conducting/radiating layer formed on the portion of the surface of the insulating substrate where the wiring layer and the die bonding pad are not formed, in such a manner that the heat conducting/radiating layer is thermally connected to the die bonding pad;

a heat conducting/radiating layer formed on the rear surface of the insulating substrate; and a heat bridge through which the die bonding pad or the heat conducting/radiating layer thermally connected to the die bonding pad is connected to the heat conducting/radiating layer formed on the rear surface of the insulating substrate.

The third means is a circuit board comprising: an insulating substrate; and a die bonding pad for fixedly bonding a semiconductor element onto the insulating substrate; and a wiring layer, in such a manner that the die bonding pad and the wire layer are formed on the insulating substrate, which, according to another aspect of the invention, comprises:

a heat conducting/radiating layer formed on the portion of the surface of the insulating substrate where the wiring layer and the die bonding pad are not formed, in such a manner that the heat conducting/radiating layer is thermally connected to the die bonding pad;

a heat conducting/radiating layer formed on the rear surface of the insulating substrate;

a wiring layer formed in the insulating substrate; and a heat bridge through which the die bonding pad or the heat conducting/radiating layer thermally connected to the die bonding pad is connected to the heat conducting/radiating layer formed on the rear surface of the insulating substrate or the wiring layer formed in the insulating substrate.

The circuit board of the invention has the heat conducting/radiating layer on the portion of its surface where no wiring circuit is provided, in such a manner that the layer is close to a heat generating component such as a semiconductor element or LSI. Hence, in the circuit board, the heat conduction and the heat radiation are performed with high efficiency, although the circuit board materials are used as they are. The circuit board formed according to the invention is light in weight, and low in manufacturing cost.

The nature, utility and principle of the invention will be more clearly understood from the following detailed description and the appended claims when read in conjunction with the accompanying drawings.

DESCRIPTION OF THE PREFERRED EMBODIMENTS

Preferred embodiments of this invention will be described with reference to the accompanying drawings.

First Embodiment

A circuit board, which constitutes a first embodiment of the invention, will be described with reference to FIGS. 1 and 2.

Figure 1:
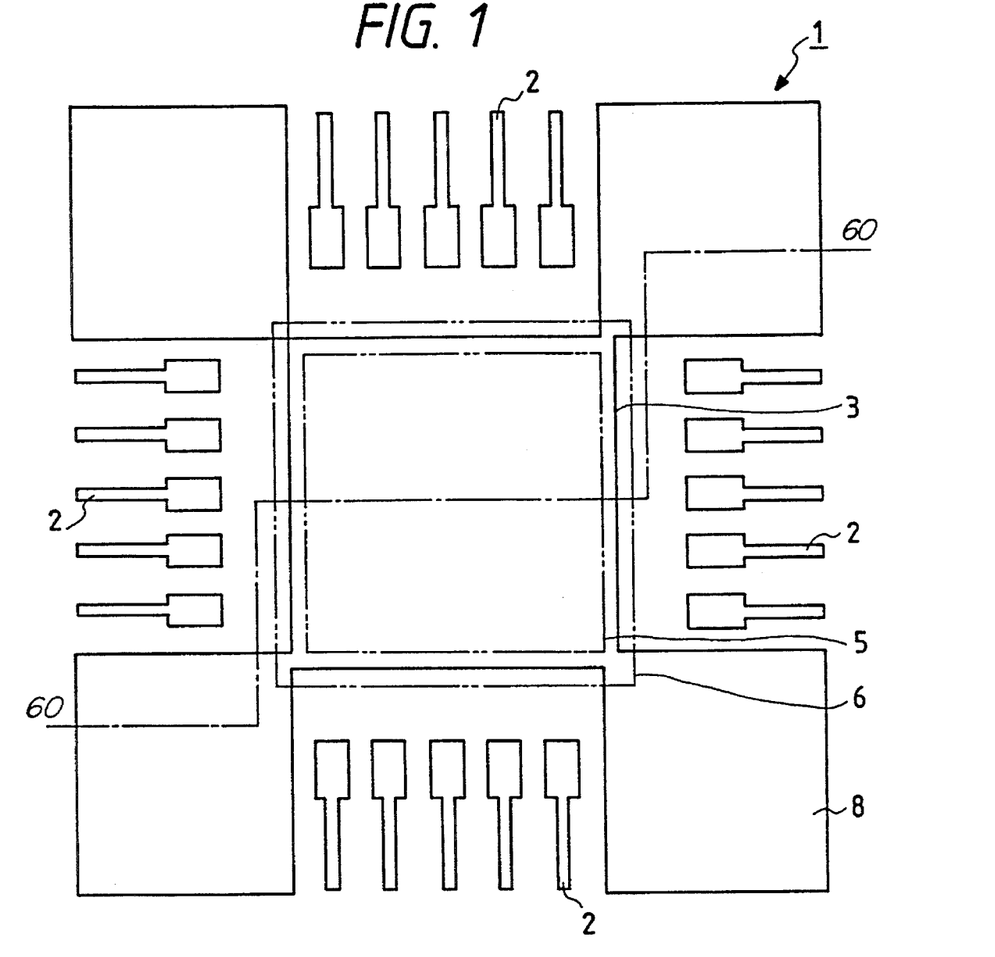
FIG. 1 is a plan view outlining the arrangement of a circuit board, which constitutes a first embodiment of this invention.
Figure 2:
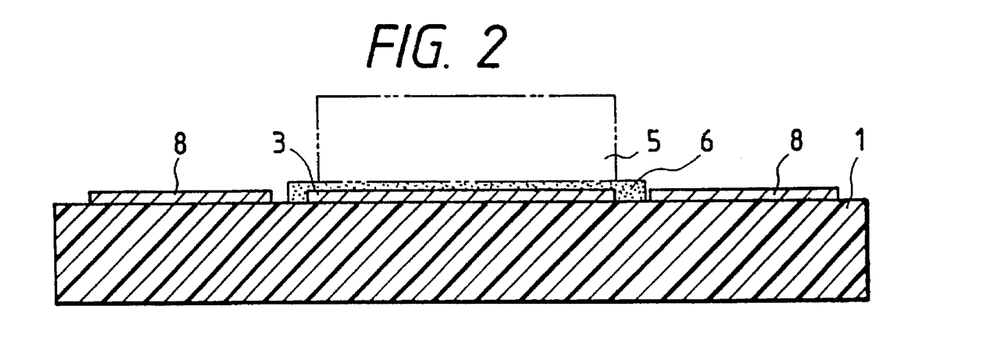
FIG. 2 is a sectional view taken along line 60—60 in FIG. 1.

As shown in FIGS. 1 and 2, a plurality of wire bonding pads 2 which are connected through bonding wires (not shown) to the terminals of a semiconductor element 5 (indicated by the phantom lines), a die bonding pad 3, and a heat conducting/radiating surface 8 are arranged on the upper surface of an electrically insulating substrate 1, in such a manner that the die bonding pad 3 is positioned where the semiconductor element 5 is to be provided, and the heat conducting/radiating layer 8 is in contact with the die bonding pad 3. The wire bonding pads 2, the die bonding pad 3, and the heat conducting/radiating layer 8 are formed on the upper surface of the insulating substrate 1 by processing an electrically conductive material such as a copper material according to a conventional method such as etching.

The heat conducting/radiating layer 8 is formed on the portion of the upper surface of the insulating substrate 1 which portion is near a heat generating component such as a semiconductor element and has no wiring circuits.

The semiconductor element 5, which is for instance an LSI chip, is fixedly bonded to the substrate 1 with a thermally conductive adhesive agent 6 such as an adhesive agent "H70E-4" manufactured by the EpoTek company, in such a manner that the adhesive agent is in contact with the heat conducting/radiating surface 8.

The thermal contact of the die bonding pad 3 and the heat conducting/radiating layer 8 may be such that the corners of the pad 3 and the layer 8 are abutted against each other as shown in the upper left of FIG. 1, or the sides of the pad 3 and the layer 8 are partially in contact with each other as shown in the upper right or the lower left of FIG. 1, or the corners of the pad 3 and the layer 8 are lapped over each other to form a heat bridge as shown in the lower right of FIG. 1.

In the circuit board thus designed, the heat produced by the semiconductor element 5 is transmitted along two paths to the heat conducting/radiating layer 8 so as to be radiated; that is, it is transmitted through the thermally conductive adhesive agent 6 to the die bonding pad 3, and then through the heat bridge to the heat conducting/radiating layer 8, and it is transmitted through the thermal conductive adhesive agent 6 to the heat conducting/radiating layer 8.

The portion of the insulating substrate 1 where the die bonding pad 3 and the heat conducting/radiating layer 8 are close to each other, serves also as a heat bridge.

Second Embodiment

A circuit board, which constitutes a second embodiment of the invention, will be described with respect to FIGS. 3 and 4.

The second embodiment is different from the first embodiment in that a heat conducting/radiating layer is provided not only on the upper surface but also on the lower surface of the insulating substrate.

Figure 3:
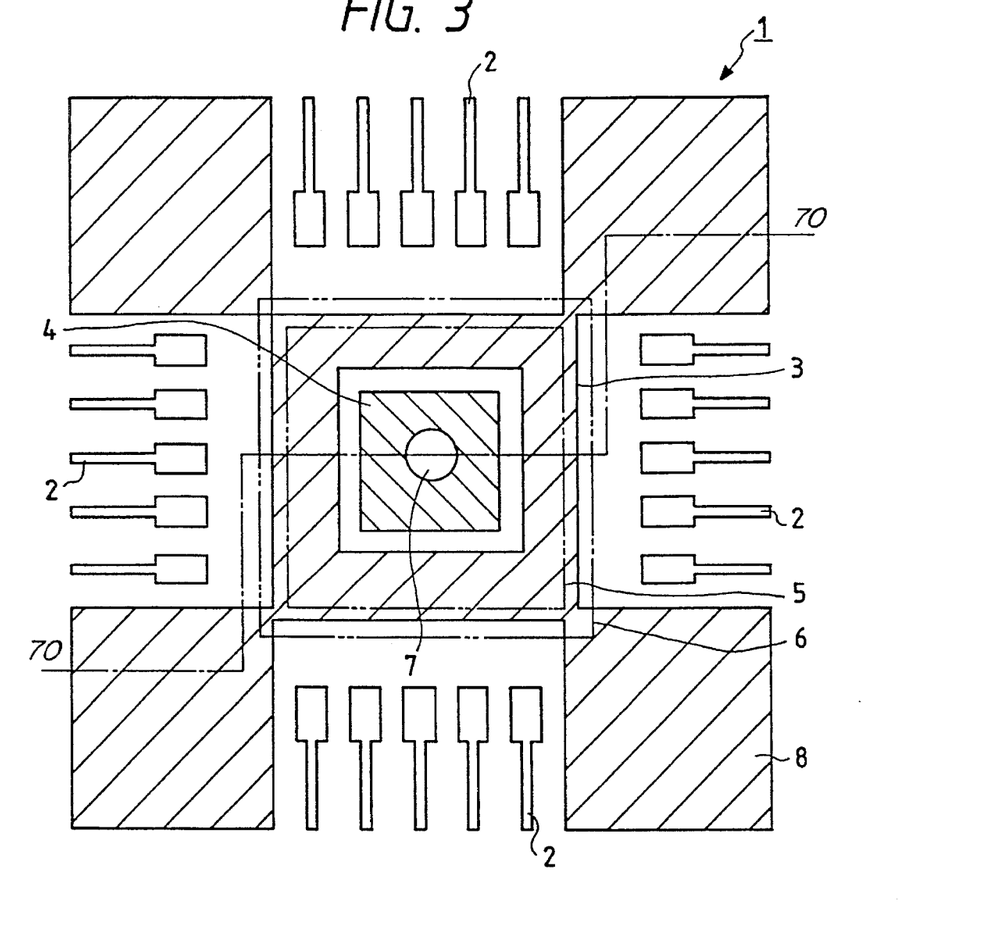
FIG. 3 is a plan view outlining the arrangement of a circuit board, which constitutes a second embodiment of the invention.
Figure 4:
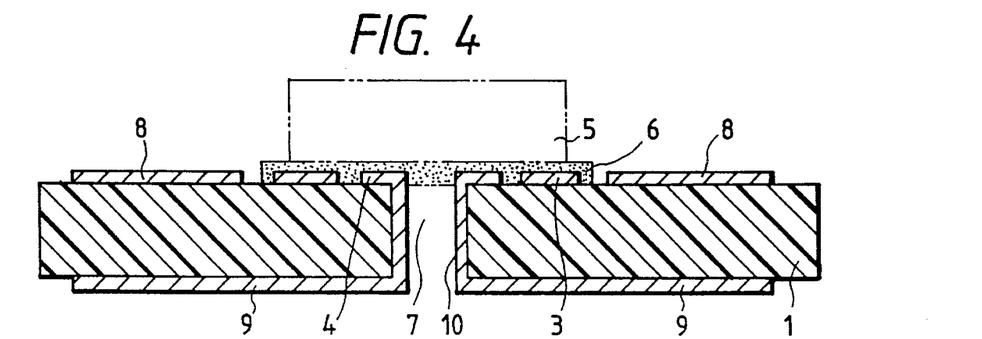
FIG. 4 is a sectional view taken along line 70—70 in FIG. 3.

As shown in FIGS. 3 and 4, a plurality of wire bonding pads 2 which are connected through bonding wires (not shown) to the terminals of a semiconductor element 5 (indicated by the phantom lines), die bonding pads 3 and 4, and a heat conducting/radiating surface 8 are arranged on the upper surface of an electrically insulating substrate 1, in such a manner that the die bonding pad 3 is positioned where the semiconductor element 5 is to be provided, and the die bonding pad 4 is connected through a through-hole 7 formed in the substrate 1 to a heat conducting/radiating layer 9 formed on the lower surface of the substrate 1, and the heat conducting/radiating layer 8 is in contact with the die bonding pad 3. The heat conducting/radiating layer 8 is formed on the portion of the upper surface of the insulating substrate 1 which portion is near a heat generating component such as a semiconductor element, and has no wiring circuits.

A heat bridge 10 is formed on the wall surface of the through-hole 7 formed in the die bonding pad 4 at the center by the conventional method, to connect the die bonding pad 4 on the upper surface of the insulating substrate 1 to the heat conducting/radiating surface 9 on the lower surface of the insulating substrate 1. Hence, the heat generated by the semiconductor element 5 is transmitted to the heat conducting/radiating means 9 on the lower surface of the insulating substrate 1.

The wire bonding pad 2, the die bonding pads 3 and 4, and the heat conducting/radiating layers 8 and 9 are formed by using an electrically conductive material such as copper material according to the conventional method.

The semiconductor element 5, which is for instance an LSI chip generating heat, is fixedly bonded to the substrate 1 with a thermally conductive adhesive agent 6 such as the aforementioned adhesive agent "H70E-4" manufactured by the EpoTek company.

The die bonding pad 3 is thermally connected to the heat conducting/radiating layer 8, while the die bonding pad 4 is connected through the through-hole 7, formed in the pad 4 at the center, to the heat conducting/radiating layer 9 formed on the lower surface of the insulating substrate 1.

The heat conducting/radiating layer 9 covers the lower surface of the insulating substrate 1 while, serving also as a grounding layer. That is, it is directly exposed in the air without being covered with "Solder-resist", (i.e. an insulating film, usually epoxy or polyimide type, provided on a metal in order to prohibit a solder from adhering thereto) or it is fixedly connected to the casing which is, for instance, made of a metal plate.

Similarly as in the first embodiment, the thermal contact of the die bonding pad 3 and the heat conducting/radiating layer 8 is such that the corners of the pad 3 and the layer 8 are abutted against each other, or the sides of the pad 3 and the layer 8 are partially in contact with each other, or the corners of the pad 3 and the layer 8 are lapped over each other, thus forming a heat bridge.

In the circuit board designed as described above, the heat produced by the semiconductor element 5 is transmitted along two paths to the heat conducting/radiating layer 8, where it is radiated; that is, it is transmitted through the thermally conductive adhesive agent 6 to the die bonding pad 3, and then through the heat bridge to the heat conducting/radiating layer 8, and it is transmitted through the thermal conductive adhesive agent 6 to the heat conducting/radiating layer 8.

In addition, the portion of the insulating substrate 1 where the die bonding pad 3 and the heat conducting/radiating layer 8 are close to each other, serves as a heat bridge.

In the heat conduction of the second embodiment, the heat is transmitted from the die bonding pad 4 through the head bridge 10 to the heat conducting/radiating layer 9 on the lower surface of the insulating substrate 1, which greatly improves the heat conducting efficiency and the heat radiating efficiency of the circuit board. This is one of the specific features of the second embodiment.

In the second embodiment, the die bonding pads 3 and 4 are insulated from each other; however, they may be at the same potential. The heat conducting/radiating layers 8 and 9 connected to the die bonding pads 3 and 4 may be so designed that, similarly as in the first embodiment, they are directly exposed in the air without being covered with the "Solder-resist" to improve the heat conducting effect and the heat radiating effect of the circuit board. In order to further improve the heat radiating effect, the heat conducting/radiating layers 8 and 9 should be increased in area as much as possible.

Third Embodiment

A circuit board, which constitutes a third embodiment of the invention, will be described with reference to FIGS. 5 and 6.

The third embodiment is different from the second embodiment in that instead of one electrical insulating substrate, a plurality of electrical insulating substrates are employed which have wiring layers therebetween (hereinafter referred to as "an insulating substrate assembly", when applicable).

Figure 5:
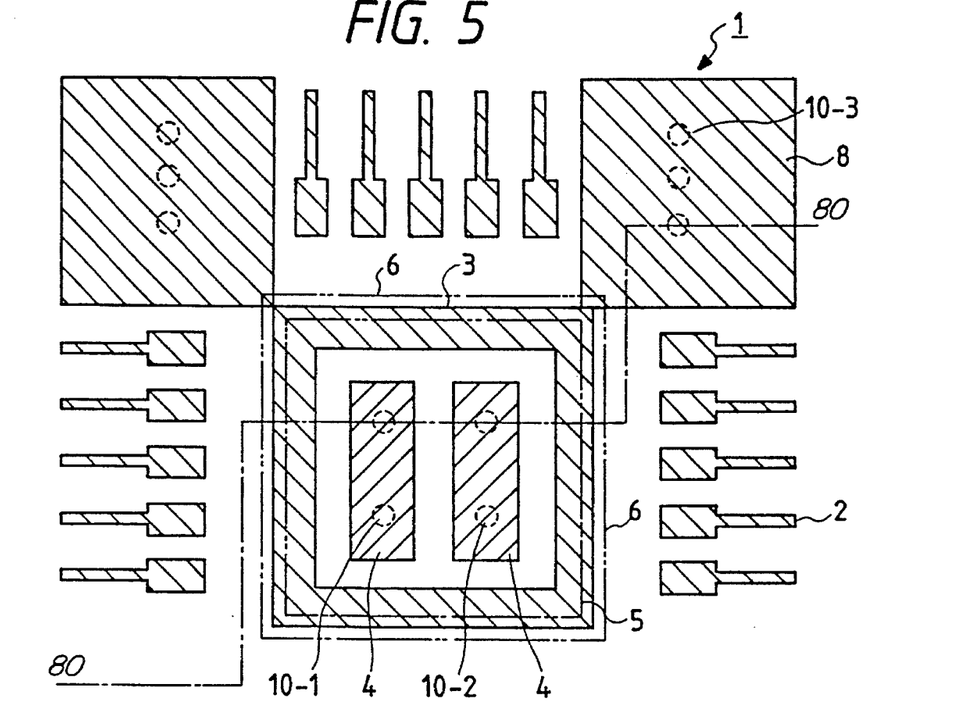
FIG. 5 is a plan view outlining the arrangement of a circuit board, which constitutes a third embodiment of the invention.
Figure 6:
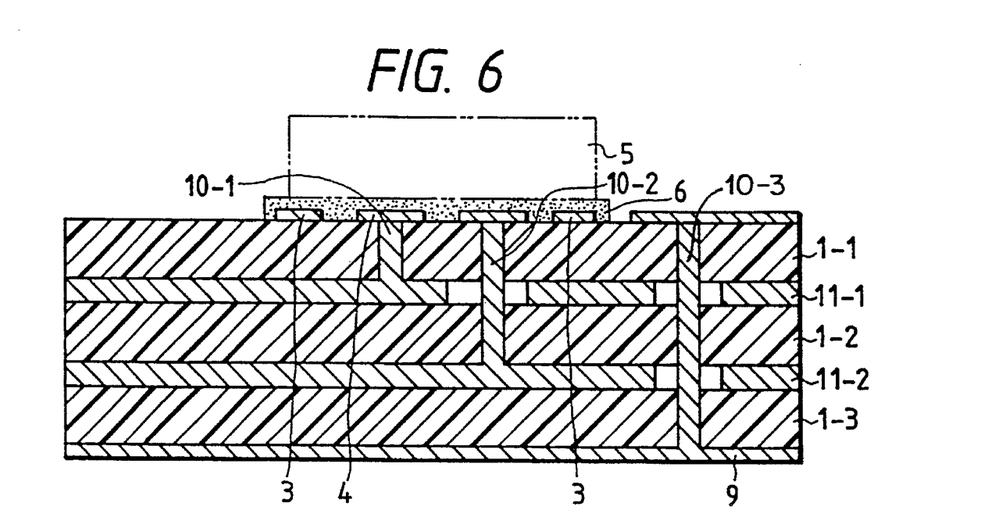
FIG. 6 is a sectional view taken along line 80—80 in FIG. 5.

As shown in FIGS. 5 and 6, a plurality of wire bonding pads 2, die bonding pads 3 and 4, a heat conducting/radiating layer 8, and a heat bridge 10-3 is arranged on the upper surface of an insulating substrate assembly 1 made up of a plurality of electrical insulating substrates 1-1, 1-2 and 1-3. The wire bonding pads 2 are connected through bonding wires (not shown) to the terminals of a semiconductor element 5, such as an LSI, as indicated by the phantom line. The die bonding pad 3 is positioned where the semiconductor element 5 is to be provided. The die bonding pads 4 are connected to wiring layers 11-1 and 11-2 held between the insulating substrates 1-1, 1-2 and 1-3 through heat bridges 10-1 and 10-2 which are formed on the wall surfaces of through-holes formed in the insulating substrates 1-1 and 1-2. The heat conducting/radiating layer 8 is in contact with the die bonding pad 3, and connected through the heat bridge 10-3 to a heat conducting/radiating layer 9 formed on the lower surface of the insulating substrate assembly 1.

The heat conducting/radiating layer 8 is formed on the portion of the upper surface of the insulating substrate 1 which portion is near a heat generating component such as a semiconductor element, and has no wiring circuit. The third embodiment is applicable particularly to the case where it is impossible for a circuit board to have a number of heat conducting/radiating layers 8.

In general, in the case where a circuit board should bear an intricate circuit, the circuit board is made up of an insulating substrate assembly including four to six insulating substrates. And, the inner two to four insulating substrates are generally employed as a positive or negative power source layers, and grounding layer, and most of the wiring layer arranged therebetween are spread wide over the circuit board. In this case, the die bonding pad formed on the substrate at the center may be divided into at least two parts which are connected to the positive or negative power source layer or grounding layer, so that the generated heat is diffused in the electrically conductive layers.

Figure 9:
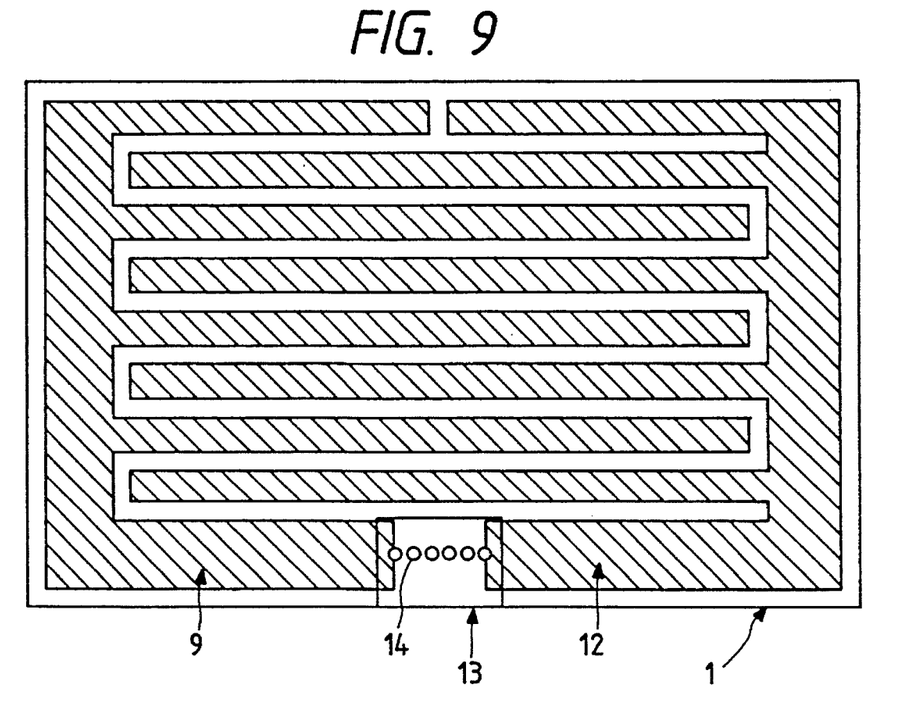
FIG. 9 is a plan view showing a concrete example of the circuit board according to the third embodiment of the invention.

FIG. 9 shows a concrete example of the circuit board according to the third embodiment. In general, in a multi-layer wiring circuit board, particularly in a multi-layer wiring circuit board made up of at least four layers, the inner layers are employed as power supplying lines or grounding lines. As shown in FIG. 9, a wiring pattern is formed on the whole area of the wiring circuit board 1, and connected to a number of semiconductor elements mounted on the circuit board 1. In the wiring pattern, a power supplying line 12 and a grounding line 9 are so designed that they are connected to the semiconductor elements with low resistance, to supply voltage uniformly to them, or to minimize the voltage drop. More specifically, those lines 12 and 9 are so designed that they are larger in width; that is, the ratio of length and width is as small as possible. The power supplying line 12 and the grounding line 9 thus designed are thermally connected through the heat bridges 10-1 and 10-2 formed in the through-holes to the heat conducting/radiating layer 8 and the bonding pad 3 which are formed on the upper surface of the circuit board.

In FIG. 9, reference numeral 13 designates a connector which is electrically connected to the power supplying line 12 and the grounding line 9. The connector 13 is, on the other hand, connected to an external casing (in the case of the grounding line) and an external power source. As shown in FIG. 9, the grounding line 9 and the power supplying line 12 are formed on the surface of the circuit board; however, they may be formed on the inner layers forming the circuit board.

The aforementioned connector 13 is electrically connected through through-holes 14 to other grounding lines and power supplying lines on the inner layers, so that the heat radiating area is greatly increased. That is, the grounding line 9 and the power supplying line 12 are thermally connected to the heat conducting/radiating layer 8 and the die bonding pad 3, so that the effective heat-radiating area is increased as much as the areas of the grounding line and the power supplying line. This arrangement is considerably effective in heat radiation. Especially in the case where the die bonding pad is thermally connected to the grounding line, and the latter is connected to the casing serving as grounding means, the heat radiating efficiency is further improved. That is, in this case, the die bonding pad 3 and the heat conducting/radiating layer 8 are thermally coupled to the casing holding the circuit board, and the casing itself acts as heat radiating means, which further improves the heat radiating efficiency.

Figure 10:
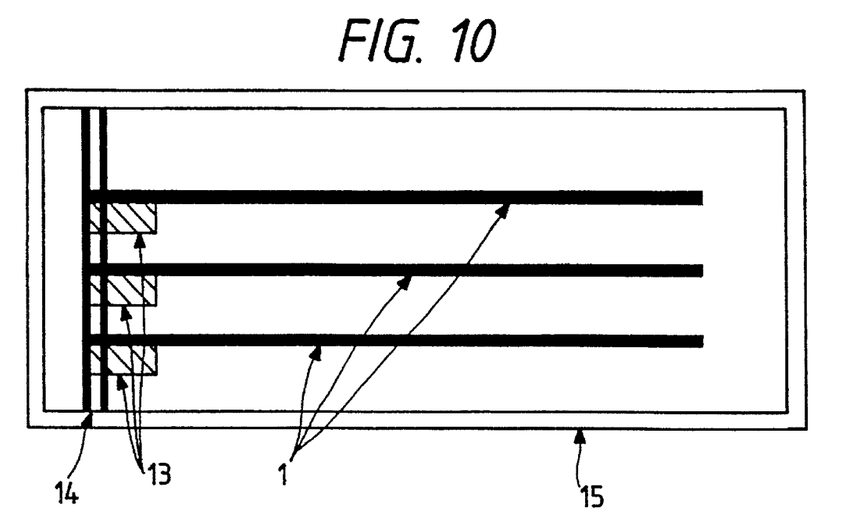
FIG. 10 is a sectional view showing a plurality of wiring boards secured to a casing according to the third embodiment of the invention.

FIG. 10 shows a plurality of wiring boards 1 secured to a casing 15 with a mounting metal part 14. The grounding lines 9 of the wiring boards and the casing 15 are grounded through the mounting metal part 14, and they are thermally connected to each other. Thus, the casing 15 also functions as heat radiating means; that is, the effective heat radiating area is further increased.

In the circuit board according to the third embodiment, the heat produced by the semiconductor element 5 is transmitted along two paths to the heat conducting/radiating layer 8, where it is radiated; that is, it is transmitted through the thermally conductive adhesive agent 6 to the die bonding pad 3, and then through the heat bridge to the heat conducting/radiating layer 8, while it is transmitted through the thermal conductive adhesive agent 6 to the heat conducting/radiating layer 8. In addition, the heat is transmitted through the heat bridge 10-3 to the heat conducting/radiating layer 9 formed on the lower surface of the insulating substrate assembly 1.

The portion of the insulating substrate assembly 1 where the die bonding pad 3 and the heat conducting/radiating layer 8 are close to each other also serves as a heat bridge between the die bonding pad 3 and the heat conducting/radiating layer 8.

A specific feature of the third embodiment resides in that the heat conduction is effected through the heat bridges 10-1 and 10-2; that is, the heat is transmitted from the die bonding pads 4 through the heat bridges to the wiring layers 11-1 and 11-2 formed between the insulating substrates, which greatly improves the heat conducting efficiency and the heat radiating efficiency of the circuit board.

The heat conducting/radiating layers 8 and 9 connected to the die bonding pads 3 and 4, similarly as in the first embodiment, may be directly exposed in the air without being covered with the "Solder-resist", to improve the heat conducting effect and the heat radiating effect of the circuit board. In order to further improve the heat radiating effect, the heat conducting/radiating layers 8 and 9 should be increased in area as much as possible.

In the circuit board according to the invention, the conducting layers are of a copper foil whose thermal conductivity is 400 W/m K, which is much higher than that of a high heat conduction substrate (10 W/m K with a high thermal-conduction substrate of ceramic, and 40 W/m K with a high thermal-conduction substrate of aluminum), and their structure and arrangement contribute to an improvement of the heat radiating characteristic. The wiring patterns on the inner layers such as the positive and negative power supplying layers and the grounding layer may be rough, and therefore the thickness of the copper foil can be increased to 70 to 200 µm larger than its ordinary thickness of 35 µm.

The heat radiating effect may be further improved by the following method: The portion of the surface area of the insulating substrate, where the semiconductor element 5 is not mounted, is employed as a grounding region, and heat radiating fins are set on the grounding region, or the grounding region is fixedly connected to the casing of metal.

In view of safety, it goes without saying that, in the case where the heat conducting/radiating layer 8 is not a grounding layer, it should be covered with "Solder-resist" or a thermally conductive adhesive agent.

EFFECTS OF THE INVENTION

As was described above, in the circuit board of the invention, the heat generated by the semiconductor element is radiated while being diffused in the heat conducting/radiating layer formed on the insulating substrate with high efficiency, without the use of a ceramic or metal based high thermal-conduction substrate. That is, a resin based substrate which is low in manufacturing cost and light in weight, can be used to form the circuit board. Furthermore, with the circuit board of the invention, the heat generated by the semiconductor element can be radiated without the use of additional radiating means or external control signals. Thus, the technical concept of the invention contributes greatly to miniaturization, weight-reduction and cost-reduction of a circuit board.

While there has been described in connection with the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

What is claimed is:

1. A circuit board, comprising:
   an insulating substrate;
   a die bonding pad for fixedly bonding a semiconductor element onto said insulating substrate;

a thermally conductive adhesive layer connecting the semiconductor element to the die bonding pad;

a plurality of wire bonding pads on said insulating substrate;

a first heat conducting/radiating layer on a top surface of said insulating substrate where said wire bonding pads and said die bonding pad are not located, said first heat conducting/radiating layer being thermally connected to said die bonding pad;

a second heat conducting/radiating layer on a rear surface of said insulating substrate; and a heat bridge connecting said die bonding pad or said first heat conducting/radiating layer to said second heat conducting/radiating layer, wherein a first heat transmission path is provided from the semiconductor element through said adhesive layer and said die bonding pad to said first heat conducting/radiating layer, a second heat transmission path is provided from the semiconductor element through said adhesive layer to said first heat conducting/radiating layer, and a third heat tranmission path is provided from the semiconductor element through said heat bridge to said second heat conducting/radiating layer.

2. A circuit board, comprising:

an insulating substrate;

a die bonding pad for fixedly bonding a semiconductor element onto said insulating substrate;

a thermally conductive adhesive layer connecting the semiconductor element to the die bonding pad;

a plurality of wire bonding pads on said insulating substrate;

a first heat conducting/radiating layer on a top surface of said insulating substrate where said wire bonding pads and said die bonding pad are not located, said first heat conducting/radiating layer being thermally connected to said die bonding pad;

a second heat conducting/radiating layer on a rear surface of said insulating substrate;

a wiring layer formed in said insulating substrate; and a heat bridge connecting said die bonding pad or said first heat conducting/radiating layer to said second heat conducting/radiating layer or said wiring layer, wherein a first heat transmission path is provided from the semiconductor element through said adhesive layer and said die bonding pad to said first heat conducting/radiating layer, a second heat transmission path is provided from the semiconductor element through said adhesive layer to said first heat conducting/radiating layer, and a third heat tranmission path is provided from the semiconductor element through said heat bridge to said second heat conducting/radiating layer.

3. A circuit board of claim 2, wherein said die bonding pad, wiring layer, and first and second heat conducting/radiating layers are made of electrically conductive material.

4. A circuit board of claim 3, wherein said electrically conductive material is copper.

5. A circuit board of claim 2, wherein said first heat conducting/radiating layer is held at a predetermined potential.

6. A circuit board of claim 5, wherein said predetermined potential is earth potential.

7. A circuit board of claim 2, further comprising:

a wiring pattern connected to a power source formed on said insulating substrate and to said first heat conducting/radiating layer.

8. A circuit board of claim 2, further comprising:

a wiring pattern on said insulating substrate, said wiring pattern being grounded and connected to said first heat conducting/radiating layer.

9. A circuit board of claim 8, further comprising:

a casing holding said insulating substrate, said casing being connected through said wiring pattern to said first heat conducting/radiating layer.

10. A circuit board of claim 2, further comprising:

a wiring substrate on said insulating substrate and having a wiring pattern grounded or connected to a power source, said wiring pattern being connected to said first heat conducting/radiating layer.

* * * * *